(12) United States Patent
Sauer

(10) Patent No.: US 10,259,331 B2
(45) Date of Patent: Apr. 16, 2019

(54) THERMALLY MONITORED CHARGING DEVICE

(71) Applicant: Bayerische Motoren Werke Aktiengesellschaft, Munich (DE)

(72) Inventor: Dirk Sauer, Dachau (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 35 days.

(21) Appl. No.: 15/783,650

(22) Filed: Oct. 13, 2017

(65) Prior Publication Data
US 2018/0050599 A1 Feb. 22, 2018

Related U.S. Application Data

(63) Continuation of application No. PCT/EP2016/058114, filed on Apr. 13, 2016.

(30) Foreign Application Priority Data

Apr. 16, 2015 (DE) .................. 10 2015 206 840

(51) Int. Cl.
*H02J 7/02* (2016.01)
*B60L 11/18* (2006.01)
(Continued)

(52) U.S. Cl.
CPC ....... *B60L 11/1818* (2013.01); *B60L 11/1816* (2013.01); *B60L 11/1824* (2013.01);
(Continued)

(58) Field of Classification Search
CPC ....... H02J 7/0042; H02J 7/0045; Y02E 60/12; H01M 10/46; H01R 13/6675
(Continued)

(56) References Cited

U.S. PATENT DOCUMENTS

| 4,755,735 A * | 7/1988 | Inakagata ............. H02J 7/0091 |
| | | 320/150 |
| 2002/0176687 A1* | 11/2002 | Diemeer ................. G02F 1/065 |
| | | 385/140 |

(Continued)

FOREIGN PATENT DOCUMENTS

CN 202221911 U 5/2012
DE 23 32 015 A1 1/1975
(Continued)

OTHER PUBLICATIONS

German-language Search Report issued in counterpart German Application No. 10 2015 206 840.4 dated Mar. 23, 2016 with partial English translation (12 pages).
(Continued)

*Primary Examiner* — Arun C Williams
(74) *Attorney, Agent, or Firm* — Crowell & Moring LLP

(57) ABSTRACT

A charging device is provided for charging an electric or hybrid vehicle from an AC power supply system. The charging device includes a supply system plug, in which charging device the supply system plug has a contact pin which is composed substantially of a first material. The charging device includes a temperature monitor. The temperature monitor has two sensor sections which are each composed substantially of a second material and which are each connected to the contact pin so that a temperature gradient within the contact pin can be detected by the temperature monitor in accordance with the principle of thermoelectric potential difference between the first material and the second material.

10 Claims, 2 Drawing Sheets

(51) Int. Cl.
*G01K 7/08* (2006.01)
*G01R 31/08* (2006.01)

(52) U.S. Cl.
CPC .............. *G01K 7/08* (2013.01); *G01R 31/08* (2013.01); *B60L 2240/36* (2013.01); *Y02T 10/7005* (2013.01); *Y02T 10/7072* (2013.01); *Y02T 90/14* (2013.01)

(58) Field of Classification Search
USPC ........................................................ 320/111
See application file for complete search history.

(56) References Cited

U.S. PATENT DOCUMENTS

| | | | | |
|---|---|---|---|---|
| 2004/0032637 | A1* | 2/2004 | Imamura | G02F 1/1345 359/245 |
| 2004/0104724 | A1* | 6/2004 | Sato | B82Y 25/00 324/224 |
| 2007/0014506 | A1* | 1/2007 | Arias Vidal | G01D 5/485 385/13 |
| 2008/0036727 | A1* | 2/2008 | Muto | G09G 3/3611 345/101 |
| 2008/0266932 | A1* | 10/2008 | Happ | G11C 11/56 365/148 |
| 2009/0246371 | A1* | 10/2009 | Koehler | H01L 21/0223 427/248.1 |
| 2009/0316321 | A1 | 12/2009 | Ouwerkerk | |
| 2012/0119702 | A1 | 5/2012 | Gaul et al. | |
| 2013/0134933 | A1 | 5/2013 | Drew et al. | |
| 2015/0064526 | A1 | 3/2015 | Ramsayer | |
| 2016/0010900 | A1* | 1/2016 | Muller | F25B 21/00 62/3.1 |

FOREIGN PATENT DOCUMENTS

| | | |
|---|---|---|
| DE | 38 38 077 C1 | 10/1989 |
| DE | 10 2009 002 429 A1 | 1/2010 |
| DE | 10 2009 034 886 A1 | 2/2011 |
| DE | 10 2012 205 303 A1 | 10/2013 |
| EP | 0 756 160 A1 | 1/1997 |
| EP | 2 502 778 A2 | 9/2012 |
| JP | 3-282223 A | 12/1991 |

OTHER PUBLICATIONS

International Search Report (PCT/ISA/210) issued in PCT Application No. PCT/EP2016/058114 dated Jul. 5, 2016 with English translation (7 pages).
German-language Written Opinion (PCT/ISA/237) issued in PCT Application No. PCT/EP2016/058114 dated Jul. 5, 2016 (7 pages).

* cited by examiner

THERMALLY MONITORED CHARGING DEVICE

CROSS REFERENCE TO RELATED APPLICATIONS

This application is a continuation of PCT International Application No. PCT/EP2016/058114, filed Apr. 13, 2016, which claims priority under 35 U.S.C. § 119 from German Patent Application No. 10 2015 206 840.4, filed Apr. 16, 2015, the entire disclosures of which are herein expressly incorporated by reference.

BACKGROUND AND SUMMARY OF THE INVENTION

The invention relates to a charging device for charging an electric or hybrid vehicle on an AC power supply system, wherein the charging device has a power supply system plug.

Charging devices for electric vehicles or hybrid vehicles with which a charging connection can be formed between the vehicle and a power supply system are known from the prior art. For example, document CN 202221911 U (D1) discloses such a charging connection which includes a vehicle-side plug (3 in FIG. 1 of D1), a power supply system plug (2 in FIG. 1 of D1) and charging electronics (1 in FIG. 1 of D1).

For the purpose of overheat protection, the charging device is equipped with a temperature sensor which is located in the vehicle-side plug. The temperature sensor ensures thermal monitoring during charging and is intended to avoid overheating, in particular to protect the electrical energy store of the vehicle.

An object of the invention is to provide an improved charging device with thermal monitoring.

This and other objects are achieved by a charging device for charging an electric or hybrid vehicle on an AC power supply system, wherein the charging device comprises a power supply system plug. The power supply system plug comprises a contact pin which is composed essentially of a first material. The charging device comprises a temperature monitor. The temperature monitor comprises two sensor sections which are essentially composed of a second material and which are each connected to the contact pin, wherein the temperature monitor can detect a temperature gradient within the contact pin according to the principle of thermoelectrical potential difference between the first material and the second material.

According to the invention, the charging device includes a temperature monitor, and the power supply system plug includes a contact pin which is composed essentially of a first material, wherein the temperature monitor has two sensor sections which are essentially composed of a second material and which are each connected to the contact pin. The result is that the temperature monitor can detect a temperature gradient within the contact pin according to the principle of the thermoelectric potential difference between the first material and the second material.

It is advantageous here that the temperature monitor can measure a voltage difference which is in direct relationship with a temperature gradient in the contact pin. The two sensor sections are connected to the contact pin. The contact pin has two connecting locations to one sensor section in each case. At each of these two connecting locations, a temperature-dependent contact voltage is formed between the first material and the second material, which second material is different from the first material. Therefore, if a potential (voltage) difference is present between the sensor sections, this means, on the one hand, that given the same configuration of materials different contact voltages are present at the two connecting locations. This is equivalent to a difference in temperature between the connecting locations. According to the principles of the Seebeck effect, i.e. according to the principles of the temperature-dependence of the thermal forces of the thermoelectrical voltage series, an increased voltage means an increased temperature difference between the connecting locations and consequently a temperature gradient within the contact pin.

In this way it can therefore be detected, for example, whether thermal power is generated at the contact location of the contact pin with a contact spring of a socket of the AC power supply system. In such a case, a temperature gradient with a negative gradient is formed originating from the contact location and can be detected with the temperature monitor. It is therefore possible, for example, to reliably detect an increased contact resistance between the contact pin and the contact spring, which contact resistance entails such a temperature gradient in the contact pin. The sensitivity of the temperature monitor is higher the greater the temperature gradient between the connecting locations, i.e. the larger the component of the spatial distance between the connecting locations, which component is directed along the temperature gradient. In other words, in order to detect typical temperature gradients within the contact pin, the connecting locations are selected such that one of the connecting locations is located in a region of the contact pin which is as cold as possible, and the other connecting location is located in a region of the contact pin which is as hot as possible.

According to one embodiment of the invention, the two sensor sections are each connected to the contact pin at one plug-side end of the sensor section.

By means of a direct connection, a temperature gradient which is formed in the contact pin can be detected very quickly. In particular, if the charging connection between the power supply system and the vehicle is subjected to a continuous load with current strengths near to the specification limit of the power supply system plug or of the corresponding socket of the power supply system plug, heating as a result of an increased contact resistance can be detected directly at the source where it is generated.

According to one preferred embodiment of the invention, each of the contact pins is provided with sensor sections. As a result, each of the contact pins can be monitored by the temperature monitor independently of the other contact pin.

Furthermore it is appropriate if the charging device comprises a charging electronics unit. The charging electronics unit is configured to measure and evaluate the thermoelectrical voltage drop between the sensor sections. The two sensor sections are for this purpose each connected to the charging electronics unit at the end of the sensor section lying opposite the plug-side end.

It is therefore possible, for example, for the charging process to be interrupted by the charging electronics unit if the latter measures an excessively high voltage drop between the sensor sections, i.e. an excessively high temperature gradient within the contact pin, or a voltage drop between the sensor sections which changes too quickly, i.e. an excessively high thermal power input in the contact pin. For this purpose, the charging electronics unit repeatedly measures the voltage drop between the sensor sections at a predefineable frequency and evaluates the measured voltage drop according to each measurement result. In this context, "evaluation" means that a temperature difference between the two connecting locations of the contact pin is assigned to the measured voltage drop on the basis of a characteristic diagram which is stored in the charging electronics unit. In the case of an excessively high temperature difference or in the case of a temperature difference which changes too quickly, the charging process can be interrupted by the charging electronics unit or the charging current can be reduced. In this way, damage to the power supply system plug or to the corresponding socket due to overheating is prevented.

According to a further embodiment of the invention, the charging electronics unit comprises a microcontroller. The microcontroller has an analog-to-digital input for the ends of the sensor sections which lie opposite the respective plug-side end, in order to measure a voltage between the sensor sections.

A microcontroller is therefore provided in the charging electronics unit in order to operate the temperature monitor. The microcontroller carries out, in particular, the measurement of the voltage drop between the sensor sections and the evaluation of the measured voltage drop. For this purpose, the voltage drop, which is measured in an analog fashion, is digitized for further data processing.

According to one particularly preferred embodiment, the first material and the second material are respectively two different metals. For example, the contact pin is predominantly composed of iron and the voltage sections of copper. Iron ensures good electrical conductivity between the contact pin and the contact spring. Copper is a suitable conductor for a robust voltage measurement between the sensor sections. According to the thermoelectrical voltage series, metals additionally have a particularly high Seebeck coefficient. The two metals can furthermore be placed directly in contact with one another via an intermetal connection.

For example, the connection of the respective plug-side end of the sensor section to the contact pin can be embodied as a soldered connection between the first metal and the second metal. Alternatively, there can be a welded connection. Both connecting techniques are customary and favorable metal processing methods which have virtually no influence on the Seebeck effect.

According to one particularly preferred embodiment of the invention, the charging device comprises a vehicle plug. For the purpose of charging, the charging device is connected to the vehicle via the vehicle plug and to the power supply system via the power supply system plug. The plugs are connected by a cable which accommodates the electrical lead conductors. The charging electronics unit is integrated into the cable or into one of the two plugs.

The invention is based on the ideas presented below.

It is therefore proposed that a direct metallic connection between the electric vehicle or hybrid vehicle between a suitable thermoelectric voltage metal requires a possibility of charging via the general 230V AC power supply system. For this purpose, charging devices, which permit an electrical energy transfer between the power supply system and the vehicle, are sold for contemporary vehicles. For this purpose, the charging device is connected both to the vehicle and to the power supply system. Therefore, these charging devices are often also referred to as charging cables which have a vehicle-side plug (charging plug) and a power supply system plug for the power supply system.

In order to charge an electric vehicle or hybrid vehicle in an acceptable amount of time, very high charging currents are required which extend close to the specification limit of the sockets of the 230V AC power supply system. Shockproof, plug type F or CEE 7/4 sockets, which are known to a person skilled in the art, are typically used, at least in large parts of Europe for domestic applications, owing to their widespread use. The abovementioned power supply system plug is compatible with one of these socket variants.

A rated voltage of 230V at a rated frequency of 50 Hz is associated with the use of the shockproof plug system. The sockets, the corresponding plugs and the cable lines are generally configured for a brief current strength of 16 A. This corresponds to an electrical power of approximately 3.7 kW. However, only continuous loading with current strengths between 10 A and 12 A is generally permissible. For continuous loading with 16 A over an uninterrupted time period of 6 h, special plug-socket types, such as so-called "camping or caravan connectors," are permitted. This is stated, for example in the IEC 60309 standard.

The shockproof plug has two contact pins with 4.8 mm diameter, 19 mm length and 19 mm axial spacing for the phase conductor and the neutral conductor. The corresponding socket has contact springs into which the contact pins engage when the plug is plugged into the socket. Owing to wear as a result of plugging in and withdrawing the plug, the electrical contact resistances between the contact pins of the plug and the contact springs of the socket can increase. The contact resistances can also be increased as a result of aging by corrosion, for example by use of the plug system outdoors or in a damp environment. However, incorrect installation or low product quality of the plugs can also cause this effect. An increased contact resistance causes thermal power ($P_{thermal}$) to be released at the contact location between the respective contact pin and the contact spring. This effect already occurs at a contact resistance ($R_{contact\ resistance}$) which is increased by a few 0.1 ohms, according to the question:

$$P_{thermal} = I_{max}^2 \cdot R_{contact\ resistance},$$

and is approximately 7.2 Watts in the case of a resistance which has increased by 0.5 ohms given a current strength of 12 A. Under continuous load, such a release of heat can result in a thermal event, for example due to melting of the plug which is fabricated from plastics.

It therefore proposed to provide the contact pins with an electronic temperature monitoring system. For this purpose, the charging device is equipped with monitoring electronics, and the contact pins with temperature sensors. Known temperature sensors, such as PTC sensors or NTC sensors, perform a similar purpose, but they are disadvantageous solutions owing to their comparatively high cost and the thermal contact resistance between the contact pin and the sensor.

It is therefore also proposed to produce a direct metallic connection, for example by welding or soldering, between a suitable thermoelectric voltage metal and the contact pins. Depending on the contact pin, two connecting locations, each with a wire section of the thermoelectric voltage metal, are provided for this purpose. Owing to the thermoelectric voltage metal effect, a voltage drop occurs between the two wire sections if a temperature gradient is formed between the two connecting locations in the contact pin. For this reason, the two connecting locations should therefore be provided with the greatest possible spatial distance. As a result, temperature differences within a contact pin can be resolved better in terms of measuring the equipment. For the evaluation of the measurement, a microcontroller is provided in the charging device, which microcontroller has one thermoelectric voltage input per contact pin.

Other objects, advantages and novel features of the present invention will become apparent from the following detailed description of one or more preferred embodiments when considered in conjunction with the accompanying drawings.

DETAILED DESCRIPTION OF THE DRAWINGS

Figure 1:
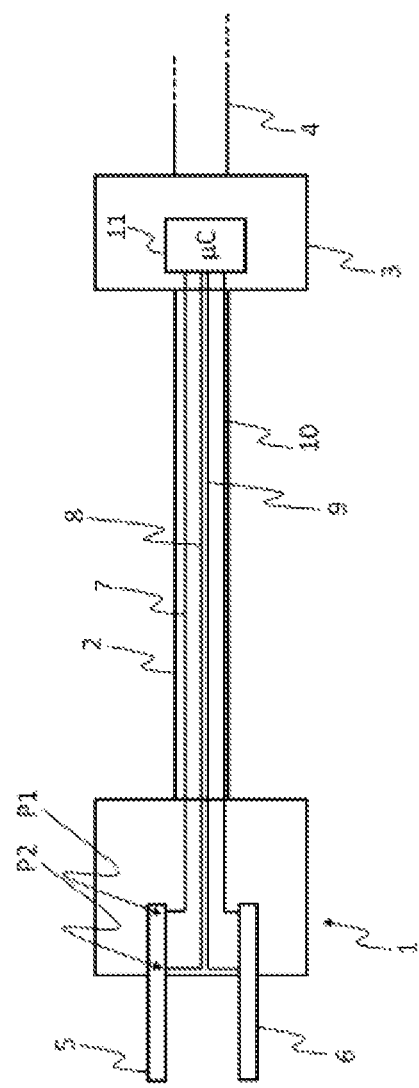
FIG. 1 is a schematic diagram of a charging device with a temperature monitor.

FIG. 1 shows a section of a charging device for an electric vehicle or hybrid vehicle. The charging device is configured to charge the vehicle at an external energy source. For this purpose, the vehicle is connected to the external energy source via the charging device. The external energy source is usually the general power supply system or domestic power supply system of the end user. For this reason, the charging device is often also referred to as a charging cable. For this purpose, the charging device has a power supply system plug (1). A power supply system cable (2, 4) is attached to the power supply system plug. Charging electronics (3) are integrated into the power supply system cable. The charging electronics are preferably embodied such that the two sections of the power supply system cable (2 and 4), which are connected to the charging electronics, can be wound onto a housing of the charging electronics when the charging device is not in use. A vehicle plug, which is compatible with a socket on the vehicle is attached to the end of the charging cable (4) which lies opposite the power supply system plug side. The charging connection is produced here by virtue of the fact that the power supply system plug (1) is plugged into a socket of the domestic power supply system, and the vehicle plug is plugged into the charging socket of the vehicle. A charging process is open-loop and closed-loop controlled by the charging electronics.

According to a further embodiment of the invention, instead of integrating charging electronics into the cable, it is also possible to integrate the charging electronics into the power supply system plug or into the vehicle plug, with the result that the two plugs connect a cable which is uniform over the entire length.

According to FIG. 1, the power supply system plug (1) has two contact pins essentially made of iron (Fe). One of the two contact pins (5) is assigned to a phase conductor, and the other contact pin (6) is assigned to a neutral conductor. It is assumed that there is a 230 V AC power supply system, which is widespread in Europe. The exemplary embodiment is based on a shockproof plug as the plug type. Corresponding electrical conductors are present in the cables (2 and 4). Additionally, four copper-nickel (CuNi) wire sections (7-10) run in the cable section (2), i.e. between the power supply system plug and the charging electronics (3), which wire sections run between the power supply system plug and a microcontroller (11) which is part of the charging electronics. In each case two of the copper-nickel wire sections are assigned to one of the contact pins and are connected to the contact pin at two different points thereof in each case. For example, the wire section (7) is connected to the contact pin (5) at the point (P1), and the wire section (8) is connected to the contact pin (5) at the point (P2). The connecting locations are produced by soldering.

Temperature-dependent contact voltages are formed between the metals Fe and CuNi, that is at each of points P1 and P2 a voltage difference is formed between the contact pin and the wire, which difference is dependent on the temperature. Therefore, if different temperatures are present at the points P1 and P2, the two wires (7) and (8) also have different voltages, with the result that a voltage difference between the two wires can be measured by the microcontroller. This measurement can be repeated at a frequency which can be stored in the microcontroller.

Figure 2:
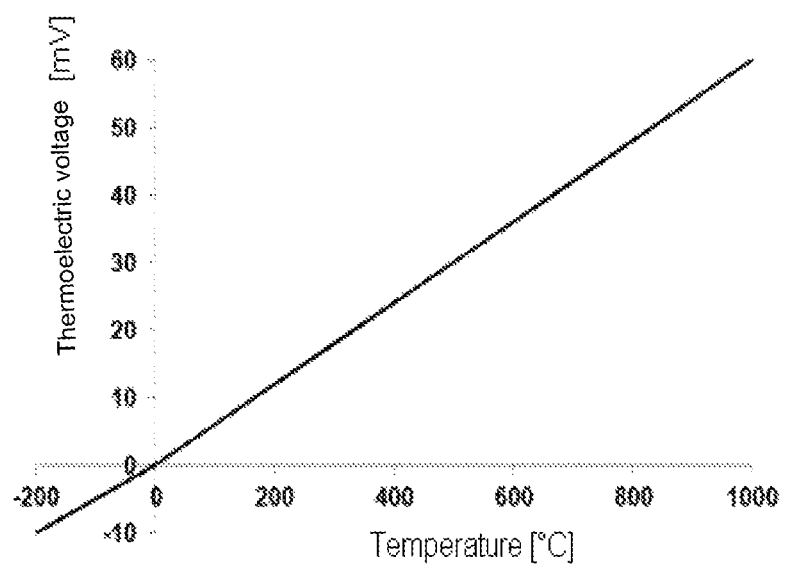
FIG. 2 is a graphical diagram illustrating the thermoelectric voltage vs. temperature of the metal combination Fe—CuNi

FIG. 2 shows the profile of the thermoelectric voltage plotted against the temperature, such a profile is stored in the microcontroller. The greater a temperature gradient which is formed within the contact pin, the greater the measured voltage difference between the wires of the contact pin. This effect is utilized to use the arrangement of the wires and of the microcontroller as a temperature monitor for the contact pins during a charging process. With each measurement, the microcontroller assigns a temperature gradient to the measured voltage difference. This evaluation is carried out digitally by the microcontroller after an analog-to-digital conversion step. The evaluation result is transmitted by the microcontroller to the charging electronics by way of a status message or by way of an instruction.

A thermal release during charging preferably occurs at the current-carrying contact location between the contact pin and a corresponding contact spring of the power supply system socket if the contact resistance is increased at this location. This can be attributed to corrosion of the contact pin or of the contact spring. The contact pin is then seated directly in the source of electrical thermal power, and the temperature in the interior of the contact pin rises starting from the contact location. Consequently, a temperature gradient is formed within the pin, which gradient can be detected according to the above method. This method on the temperature gradients within the contact pin is sensitive, it is independent of the absolute temperature of the plug. This is particularly advantageous if, for example, charging takes place in the open air and the charging device is subjected to solar radiation. This is a particular advantage compared to customary systems which are sensitive to absolute temperatures. Furthermore the temperature monitor can be implemented cost-effectively and can monitor the two contact pins separately from one another via the respectively assigned wire pairs. It is also advantageous that the monitoring responds without a delay, since the pins are monitored directly and not, for example, only the body of the plug. In addition, the temperature monitor is very robust and is hardly susceptible to faults, since the wires have a directly intermetallic connection to the contact pins.

Therefore, if a rise in temperature is detected within one of the contact pins beyond a profile amount stored in the microcontroller (e.g. 50° C. temperature difference between the points P1 and P2), this indicates high input heat to the contact pin and the charging process can be aborted. Therefore, damage to the socket and to the power supply system plug are avoided. In order to permit further charging of the battery of the vehicle, according to a further embodiment, a closed-loop controller can be provided which re-starts an interrupted charging process. The interruption and the restarting of the charging are repeated alternately, if appropriate. This achieves at least section-wise partial charging of the battery of the vehicle.

According to an alternative embodiment, the charging current is lowered by the charging electronics as a function of the status information of the cyclically operating microcontroller in such a way that the temperature gradient consequently undershoots the profile amount stored in the microcontroller. This does not bring about an interruption but rather a lengthening of the charging process.

According to one development, when the charging current is interrupted or lowered as described above, the charging electronics transmits warning information to the user of the vehicle or to the vehicle. This warning message can be a signal light or an input into the display of the charging electronics itself, or can be transmitted via a radio device (e.g. WLAN or GSM) of the charging electronics. Alternatively, the cable section (4) has a data line which permits direct communication of the charging electronics with the vehicle, with the result that a message can be generated in a cockpit instrument of the vehicle. The warning message has the objective of informing the user to check the functional capability of the charging device and of the sockets which are being used. The user can furthermore be informed of the lengthening of the charging time (or of the charging process).

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A charging device for charging an electric or hybrid vehicle via an AC power supply system, the charging device comprising:
    a power supply system plug having a contact pin substantially composed of a first material;
    a temperature monitor of the charging device, the temperature monitor having two sensor sections substantially composed of a second material, the two sensor sections being connected to the contact pin, wherein the temperature monitor detects a temperature gradient within the contact pin based on a principle of a thermoelectric potential difference between the first material and the second material.

2. The charging device as claimed in claim 1, wherein the two sensor sections are each connected to the contact pin at one plug-side end of the sensor section.

3. The charging device as claimed in claim 2, further comprising:
    a charging electronics unit of the charging device.

4. The charging device as claimed in claim 3, wherein the two sensor sections are each connected to the charging electronics unit at the end of the sensor section lying opposite the plug-side end.

5. The charging device as claimed in claim 4, wherein the charging electronics unit comprises a microcontroller, and
    the microcontroller has an analog-to-digital input for the ends of the sensor sections which lie opposite the respective plug-side end, in order to measure a voltage between the sensor sections.

6. The charging device as claimed in claim 1, wherein the first material is a first metal.

7. The charging device as claimed in claim 6, wherein the second material is a second metal.

8. The charging device as claimed in claim 7, wherein the connection of the respective plug-side end of the sensor section to the contact pin is a soldered connection between the first metal and the second metal.

9. The charging device as claimed in claim 7, wherein the connection of the respective plug-side end of the sensor section to the contact pin is a welded connection between the first metal and the second metal.

10. The charging device as claimed in claim 1, further comprising:
    a vehicle plug of the charging device.

* * * * *